(12) United States Patent
Takahashi et al.

(10) Patent No.: US 8,976,832 B2
(45) Date of Patent: Mar. 10, 2015

(54) MULTI-WAVELENGTH SEMICONDUCTOR LASER DEVICE

(75) Inventors: Yoshihiko Takahashi, Miyagi (JP); Fumitake Oikawa, Miyagi (JP)

(73) Assignee: Sony Corporation (JP)

( * ) Notice: Subject to any disclaimer, the term of this patent is extended or adjusted under 35 U.S.C. 154(b) by 28 days.

(21) Appl. No.: 13/421,260

(22) Filed: Mar. 15, 2012

(65) Prior Publication Data

US 2012/0250718 A1    Oct. 4, 2012

(30) Foreign Application Priority Data

Mar. 30, 2011  (JP) ................................. 2011-075471
May 24, 2011  (JP) ................................. 2011-116106

(51) Int. Cl.
| | | |
|---|---|---|
| *H01S 5/00* | (2006.01) | |
| *G11B 7/1275* | (2012.01) | |
| *H01S 5/028* | (2006.01) | |
| *H01S 5/40* | (2006.01) | |
| *H01S 5/026* | (2006.01) | |
| *H01S 5/22* | (2006.01) | |
| *H01S 5/343* | (2006.01) | |

(52) U.S. Cl.
CPC ............ *G11B 7/1275* (2013.01); *H01S 5/0287* (2013.01); *H01S 5/4031* (2013.01); *H01S 5/4087* (2013.01); *H01S 5/026* (2013.01); *H01S 5/22* (2013.01); *H01S 5/343* (2013.01); *H01S 5/34326* (2013.01); *H01S 5/0284* (2013.01); *H01S 2301/176* (2013.01)
USPC .................... 372/49.01; 372/50.1; 372/50.121

(58) Field of Classification Search
USPC .................................. 372/49.01, 50.1, 50.121
See application file for complete search history.

(56) References Cited

U.S. PATENT DOCUMENTS

| | | | | |
|---|---|---|---|---|
| 5,982,799 | A * | 11/1999 | Bour et al. ................ | 372/50.121 |
| 2005/0069005 | A1* | 3/2005 | Nishida et al. .................. | 372/50 |
| 2006/0227831 | A1* | 10/2006 | Nishida et al. ............. | 372/43.01 |
| 2007/0280307 | A1* | 12/2007 | Kunitsugu et al. .............. | 372/23 |
| 2010/0238784 | A1* | 9/2010 | Takahashi ..................... | 369/121 |
| 2011/0164643 | A1* | 7/2011 | Tohyama et al. .......... | 372/49.01 |

* cited by examiner

*Primary Examiner* — Yuanda Zhang
(74) *Attorney, Agent, or Firm* — Sheridan Ross P.C.

(57) ABSTRACT

A multi-wavelength semiconductor laser device includes: first and second device sections monolithically formed on a substrate; and a rear end face film formed together on a rear end face of each of the first and second device sections. The first device section is a light-emitting device section having an oscillation wavelength of $\lambda_1$. The second device section is a light-emitting device section having an oscillation wavelength of $\lambda_2$ ($\lambda_1 < \lambda_2$). The rear end face film includes a layer in which N sets (N≥2) of layers each having the combination of a low refractive index layer having a refractive index of $n_1$ and a high refractive index layer having a refractive index of $n_3$ ($n_1 < n_3$) as one set are laminated, and an intermediate refractive index layer having a refractive index of $n_2$ ($n_1 < n_2 < n_3$) in order from the rear end face side, and is constituted by a film different from an Si film.

10 Claims, 5 Drawing Sheets

FIG.2
| 1st LAYER | 2nd LAYER | 3rd LAYER | 4th LAYER | 5th LAYER | 6th LAYER | 7th LAYER | 8th LAYER |
|---|---|---|---|---|---|---|---|
| 41 | 42 | 43 | 42 | 43 | 42 | 43 | 44 |
| $Al_2O_3$ | $SiO_2$ | $Ta_2O_5$ | $SiO_2$ | $Ta_2O_5$ | $SiO_2$ | $Ta_2O_5$ | $Al_2O_3$ |
| — | $SiO_2$ | $Ta_2O_5$ | $SiO_2$ | $Ta_2O_5$ | $SiO_2$ | $Ta_2O_5$ | $Al_2O_3$ |
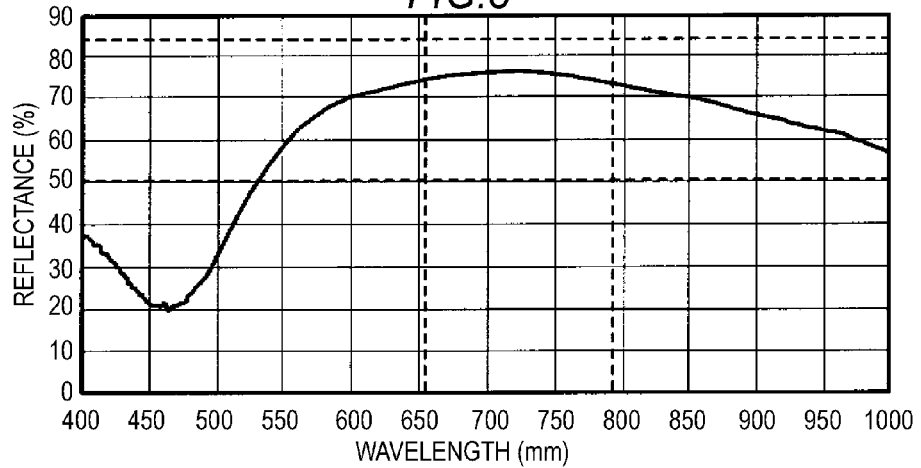
FIG.3
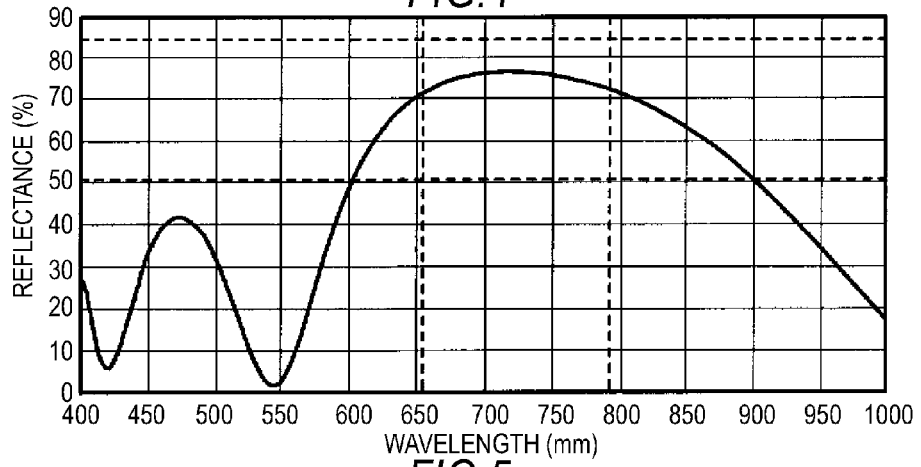
FIG.4
FIG.5
| 1st LAYER | 2nd LAYER | 3rd LAYER | 4th LAYER | 5th LAYER | 6th LAYER | 7th LAYER | 8th LAYER |
|---|---|---|---|---|---|---|---|
| $Al_2O_3$ | $Ta_2O_5$ | $SiO_2$ | $Ta_2O_5$ | $SiO_2$ | $Ta_2O_5$ | $SiO_2$ | $Ta_2O_5$ |

FIG.9

| 1st LAYER | 2nd LAYER | 3rd LAYER | 4th LAYER | 5th LAYER | 6th LAYER | 7th LAYER | 8th LAYER |
|---|---|---|---|---|---|---|---|
| 41 | 42 | 43 | 42 | 43 | 42 | 43 | 44 |
| $Al_2O_3$ | 42A $SiO_2$ / 42B $Al_2O_3$ | $Ta_2O_5$ | 42A $SiO_2$ / 42B $Al_2O_3$ | $Ta_2O_5$ | 42A $SiO_2$ / 42B $Al_2O_3$ | $Ta_2O_5$ | $Al_2O_3$ |
| — | 42A $SiO_2$ / 42B $Al_2O_3$ | $Ta_2O_5$ | 42A $SiO_2$ / 42B $Al_2O_3$ | $Ta_2O_5$ | 42A $SiO_2$ / 42B $Al_2O_3$ | $Ta_2O_5$ | $Al_2O_3$ |

FIG.10

| 1st LAYER | 2nd LAYER | 3rd LAYER | 4th LAYER | 5th LAYER | 6th LAYER | 7th LAYER | 8th LAYER |
|---|---|---|---|---|---|---|---|
| 41 | 42 | 43 | 42 | 43 | 42 | 43 | 44 |
| $Al_2O_3$ | 42A $Al_2O_3$ / 42B $Ta_2O_5$ | $Ta_2O_5$ | 42A $Al_2O_3$ / 42B $Ta_2O_5$ | $Ta_2O_5$ | 42A $Al_2O_3$ / 42B $Ta_2O_5$ | $Ta_2O_5$ | $Al_2O_3$ |
| — | 42A $Al_2O_3$ / 42B $Ta_2O_5$ | $Ta_2O_5$ | 42A $Al_2O_3$ / 42B $Ta_2O_5$ | $Ta_2O_5$ | 42A $Al_2O_3$ / 42B $Ta_2O_5$ | $Ta_2O_5$ | $Al_2O_3$ |

FIG.11

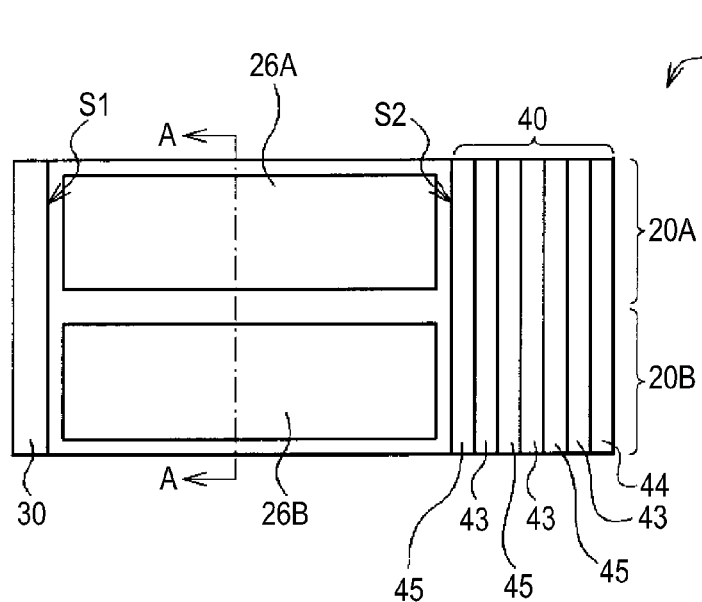

FIG.12

| 1st LAYER | 2nd LAYER | 3rd LAYER | 4th LAYER | 5th LAYER | 6th LAYER | 7th LAYER |
|---|---|---|---|---|---|---|
| 45 | 43 | 45 | 43 | 45 | 43 | 44 |
| $SiO_2$ | $Ta_2O_5$ | $SiO_2$ | $Ta_2O_5$ | $SiO_2$ | $Ta_2O_5$ | $Al_2O_3$ |

MULTI-WAVELENGTH SEMICONDUCTOR LASER DEVICE

FIELD

The present disclosure relates to a multi-wavelength semiconductor laser device having a monolithic structure, and in particular, to a multi-wavelength semiconductor laser device having an improved reflective film on the high reflectance side.

BACKGROUND

In recent years, in the field of a semiconductor laser device (LD; laser diode), a multi-wavelength laser device in which a plurality of light-emitting sections having different luminescence wavelengths are monolithically formed on the same substrate has been actively developed. The multi-wavelength laser device is used as a light source of an optical disc device, for example.

In such an optical disc device, a laser beam of a 790 nm band is used for the playback of a CD (Compact Disc) and also used for the recording and playback of a recordable optical disc such as a CD-R (CD Recordable), a CD-RW (CD Rewritable), or an MD (MiniDisc). Further, a laser beam of a 650 nm band is used for the recording and playback of a DVD (Digital Versatile Disc). By mounting the multi-wavelength laser device on the optical disc device, also with respect to any of plural types of existing optical discs, recording or playback becomes possible. By forming a laser device into a multi-wavelength structure in this manner, it becomes possible to further expand its use.

In a multi-wavelength laser device having a monolithic structure, in general, similarly to a single-wavelength laser device, a low-reflection film matched to the wavelengths of the respective laser beams is formed together on the entirety of a front end face of the laser device and a high-reflection film matched to the wavelengths of the respective laser beams is formed together on the entirety of a rear end face of the laser device. At this time, in order to obtain high reflectance, in general, the high-reflection film has a multilayer structure in which a low refractive index layer and a high refractive index layer are alternately laminated, and is constituted by the combination of materials in which a difference in refractive index between the low refractive index layer and the high refractive index layer becomes large (refer to JP-A-2008-16799 and JP-A-2010-171182).

Usually, in a multi-wavelength laser device which is used for the playback of an optical disc, in order to adjust alight output which is emitted from a front end face, emitted light from a rear end face is converted into an electric current by a photodiode and monitored. This monitor current depends largely on the reflectance of the rear end face. On the other hand, in a laser device, since a wavelength varies with a change in temperature, the larger the amount of variation in the reflectance of the rear end face with respect to a wavelength, the larger the change in monitor current with respect to the change in temperature of the device becomes.

Therefore, in the past, in order to make the amount of variation in the reflectance of a high-reflection film with respect to a change in wavelength as small as possible, as a material of the high-reflection film, a material in which a difference in refractive index between a low refractive index layer and a high refractive index layer becomes large has been used. For example, as a material of the low refractive index layer, $Al_2O_3$ (refractive index: 1.64) has been used, and as a material of the high refractive index layer, Si (refractive index: 3.3) has been used.

SUMMARY

However, in a material such as Si having a refractive index exceeding 3.0, light absorption in an oscillation wavelength of 650 nm is large and damage to a film occurs. For this reason, there is a problem in that end face degradation such as COD or ESD easily occurs. Therefore, in place of Si, use of $Ta_2O_5$ (refractive index: 2.1) in which light absorption is small can be considered. However, in such a case, since a difference in refractive index between the high refractive index layer and the low refractive index layer does not become large as much as when Si is used in the high refractive index layer, the amount of variation in the reflectance of the high-reflection film with respect to a change in wavelength becomes large. As a result, there is a problem in that variation in monitor current with a change in temperature of the laser device becomes large.

It is therefore desirable to provide a multi-wavelength semiconductor laser device in which it is possible to make the amount of variation in reflectance with respect to a change in wavelength small while suppressing occurrence of end face degradation and to suppress a temperature-related change in monitor current in each wavelength device.

An embodiment of the present disclosure is directed to a multi-wavelength semiconductor laser device including: first and second device sections monolithically formed on a substrate; and a rear end face film formed together on a rear end face of each of the first device section and the second device section, wherein the first device section is a light-emitting device section having an oscillation wavelength of $\lambda_1$, the second device section is a light-emitting device section having an oscillation wavelength of $\lambda_2$ ($\lambda_1 < \lambda_2$), the rear end face film includes a layer in which N sets (N≥2) of layers each having the combination of a low refractive index layer having a refractive index of $n_1$ and a high refractive index layer having a refractive index of $n_3$ ($n_1 < n_3$) as one set are laminated, and an intermediate refractive index layer having a refractive index of $n_2$ ($n_1 < n_2 < n_3$) in order from the rear end face side, and is constituted by a film different from an Si film, and the optical film thickness of each of the low refractive index layer, the high refractive index layer, and the intermediate refractive index layer is set to be $\lambda_3/4$ when a wavelength between $\lambda_1$ and $\lambda_2$ is set to be $\lambda_3$.

In the multi-wavelength semiconductor laser device according to the above embodiment of the present disclosure, the intermediate refractive index layer having a refractive index between the refractive index of the low refractive index layer and the refractive index of the high refractive index layer is formed on the surface of the layer in which the low refractive index layer and the high refractive index layer are alternately laminated on the rear end face. Further, the optical film thickness of each of these layers is set to be $\lambda_3/4$. In this way, it is possible to make the relationship between a wavelength and the reflectance of the rear end face film in a wavelength range which includes $\lambda_1$ and $\lambda_2$ flatter.

The multi-wavelength semiconductor laser device according to the above embodiment of the present disclosure may be configured such that the refractive index $n_1$ is set to be a value of not less than 1.4 and less than 1.5, the refractive index $n_2$ is set to be a value of not less than 1.5 and not more than 1.7, and the refractive index $n_3$ is set to be a value of not less than 2.0 and not more than 2.5. For example, as a material of the low refractive index layer, $SiO_2$ or the like can be given. As a material of the high refractive index layer, $Ta_2O_5$, $TiO_2$, $ZnO$, $HfO_2$, $CeO_2$, $Nb_2O$, or the like can be given. As a material of the intermediate refractive index layer, $Al_2O_3$, $MgO$, or the like can be given.

The multi-wavelength semiconductor laser device according to the above embodiment of the present disclosure may be configured such that the low refractive index layer is a layer in which an $SiO_2$ layer and an $Al_2O_3$ layer or an $MgO$ layer are combined, and the optical film thickness of the combined layer is set to be $\lambda_3/4$. Further, the multi-wavelength semiconductor laser device according to the above embodiment of the present disclosure may also be configured such that the low refractive index layer is a layer in which an $Al_2O_3$ layer or an $MgO$ layer and a $Ta_2O_5$ layer, a $TiO_2$ layer, a $ZnO$ layer, an $HfO_2$ layer, a $CeO_2$ layer, or an $Nb_2O$ layer are combined, and the optical film thickness of the combined layer is set to be $\lambda_3/4$.

Another embodiment of the present disclosure is directed to a multi-wavelength semiconductor laser device including: first and second device sections monolithically formed on a substrate; and a rear end face film formed together on a rear end face of each of the first device section and the second device section, wherein the first device section is a light-emitting device section having an oscillation wavelength of $\lambda_1$, the second device section is a light-emitting device section having an oscillation wavelength of $\lambda_2$ ($\lambda_1 < \lambda_2$), the rear end face film includes a layer in which N sets (N≥2) of layers each having the combination of a first low refractive index layer having a refractive index of $n_1$ and a high refractive index layer having a refractive index of $n_3$ ($n_1 < n_3$) as one set are laminated, and a second low refractive index layer having a refractive index of $n_1$ in order from the rear end face side, and is constituted by a film different from an Si film, and the optical film thickness of each of the first low refractive index layer, the high refractive index layer, and the second low refractive index layer is set to be $\lambda_3/4$ when a wavelength between $\lambda_1$ and $\lambda_2$ is set to be $\lambda_3$.

In the multi-wavelength semiconductor laser device according to the above embodiment of the present disclosure, the second low refractive index layer having the same refractive index as the refractive index of the first low refractive index layer is formed on the surface of the layer in which the first low refractive index layer and the high refractive index layer are alternately laminated on the rear end face. Further, the optical film thickness of each of these layers is set to be $\lambda_3/4$. In this way, it is possible to make the relationship between a wavelength and the reflectance of the rear end face film in a wavelength range which includes $\lambda_1$ and $\lambda_2$ flatter.

By using the multi-wavelength semiconductor laser devices according to the above embodiments of the present disclosure, since the reflectance of the rear end face film in a wavelength range which includes $\lambda_1$ and $\lambda_2$ has a flatter feature with respect to a wavelength, variation in reflectance with respect to a variation in wavelength can be reduced and it is possible to suppress a temperature-related change in monitor current which monitors emitted light from the rear end face. Further, in the embodiments of the present disclosure, since the rear end face film does not include an Si film, end face degradation due to an Si film does not occur. From the above, in the embodiments of the present disclosure, it is possible to suppress a change in monitor current with a change in temperature of the device while suppressing occurrence of end face degradation.

BRIEF DESCRIPTION OF THE DRAWINGS

FIG. 2 is a diagram showing one example of the internal configuration of a rear end face film in FIGS. 1A and 1B.

FIG. 3 is a diagram showing one example of the reflectance distribution on the rear end face side of a laser device provided with a rear end face film related to a comparative example.

FIG. 4 is a diagram showing another example of the reflectance distribution on the rear end face side of the laser device provided with the rear end face film related to the comparative example.

FIG. 5 is a diagram showing one example of the configuration of the rear end face film related to the comparative example.

FIG. 9 is a diagram showing one example of the configuration of a rear end face film in FIG. 8.

FIG. 10 is a diagram showing another example of the configuration of the rear end face film in FIG. 8.

FIG. 11 is a top view showing another modified example of the configuration of the two-wavelength semiconductor laser device in FIGS. 1A and 1B.

FIG. 12 is a diagram showing one example of the configuration of a rear end face film in FIG. 11.

DETAILED DESCRIPTION

Hereinafter, embodiments of the present disclosure will be described in detail with reference to the drawings. In addition, a description will be performed in the following order.

1. Embodiment

Figure 1A:
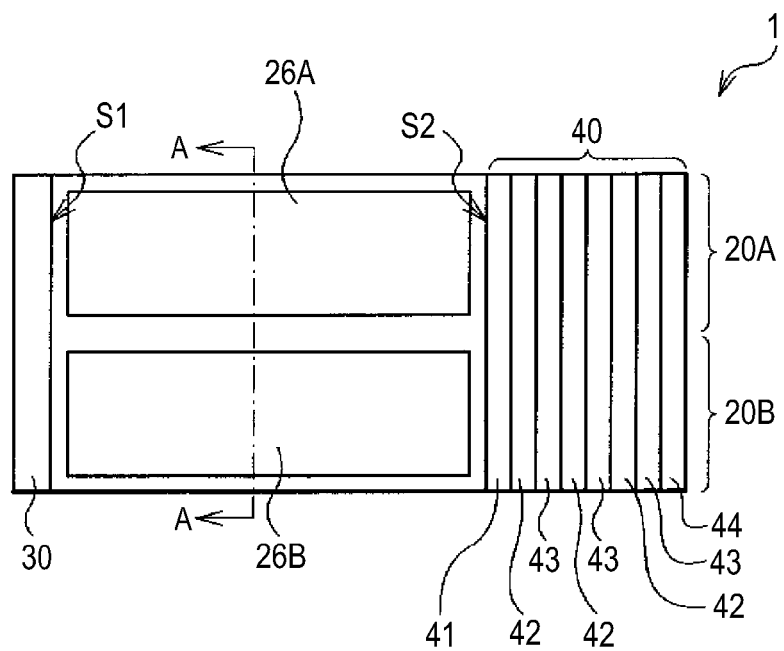
FIGS. 1A and 1B respectively are a top view and a cross-sectional view showing one example of the configuration of a two-wavelength semiconductor laser device related to an embodiment of the present disclosure.
Figure 1B:
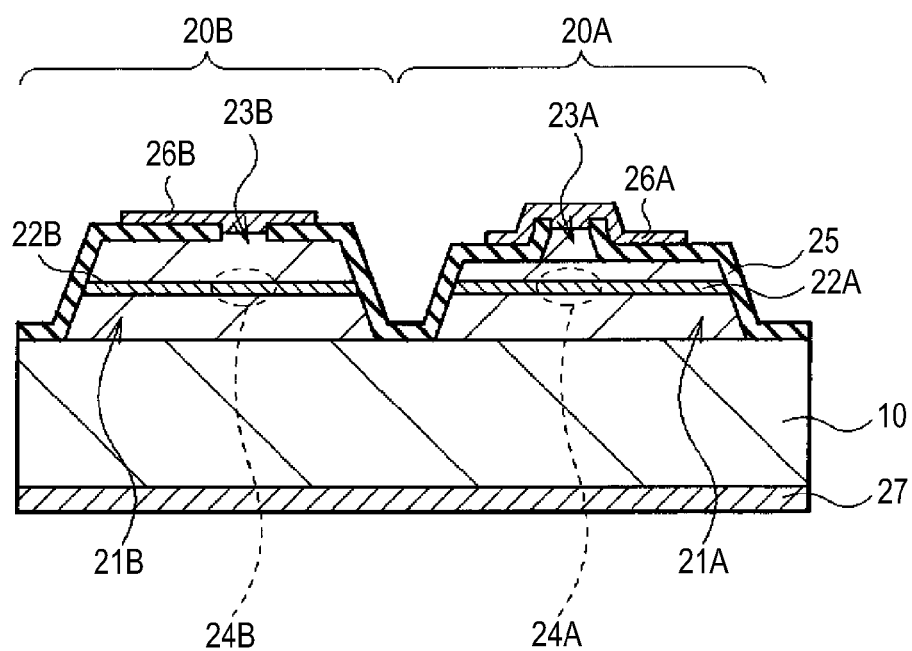

An example in which an intermediate refractive index layer is provided on the top surface side of a rear end face film 2. Modified Examples An example in which a low refractive index layer is constituted by plural layers, and an example in which an intermediate refractive index layer is also provided on the rear end face side of the rear end face film 1. Embodiment FIG. 1A shows a plane configuration of a two-wavelength semiconductor laser device 1 related to an embodiment of the present disclosure. FIG. 1B shows a cross-sectional configuration as viewed in the direction of arrow A-A of the two-wavelength semiconductor laser device 1 in FIG. 1A. FIGS. 1A and 1B schematically show the configurations and a dimension and a shape as shown therein are different from the actual dimension and shape. In addition, the two-wavelength semiconductor laser device 1 is equivalent to a specific example of a "multi-wavelength semiconductor laser device" in the appended claims.

The two-wavelength semiconductor laser device 1 includes a first device section 20A and a second device section 20B which are monolithically formed on a substrate 10.

(First Device Section 20A)

The first device section 20A is a semiconductor laser device having an oscillation wavelength of $\lambda_A$. Specifically, $\lambda_A$ is a wavelength of a 650 nm band. The first device section 20A is constituted by an aluminum gallium indium phosphorous (AlGaInP)-based Group III-V compound semiconductor. The aluminum gallium indium phosphorous (AlGaInP)-based Group III-V compound semiconductor as referred to herein refers to a semiconductor containing at least aluminum (Al), gallium (Ga), and indium (In) among Group 3B elements in the short-period type periodic table and at least phosphorous (P) among Group 5B elements in the short-period type periodic table.

The first device section 20A includes a semiconductor layer 21A grown on the substrate 10. In the semiconductor layer 21A, an n-type cladding layer, an active layer 22A, a p-type cladding layer, and a p-side contact layer are included. In addition, the layers other than the active layer 22A are not shown in particular.

Specifically, the substrate 10 is constituted by n-type GaAs, for example. The n-type cladding layer is constituted by n-type AlGaInP, for example. The active layer 22A has, for example, a multiple quantum well structure which is constituted by alternately laminating a well layer and a barrier layer. The well layer and the barrier layer are respectively constituted by, for example, $Al_xGa_yIn_{1-x-y}P$ (however, x≥0 and y≥0) having composition ratios different from each other. The p-type cladding layer is constituted by p-type AlGaInP, for example. The p-side contact layer is constituted by p-type GaAs, for example. A portion of the p-type cladding layer and the p-side contact layer form a stripe-shaped ridge portion 23A extending in a resonator direction, whereby current constriction is provided. In addition, the area just below the ridge portion 23A of the active layer 22A becomes a light-emitting area 24A.

An insulating layer 25 is provided on a continuous surface from the side surface of the ridge portion 23A to the surface of the p-type cladding layer. The insulating layer 25 is constituted by an insulating material such as $SiO_2$, $ZrO_x$, or SiN, for example, and made so as to electrically insulate the semiconductor layer 21A of the first device section 20A from a semiconductor layer 21B (described later) of the second device section 20B and also make an electric current flow to the active layer 22A only from the upper surfaces of the ridge portion 23A and a ridge portion 23B (described later). Therefore, the insulating layer 25 has a device separation function and a current constriction function.

An upper electrode 26A is provided on a continuous surface from the upper surface of the ridge portion 23A (the surface of the p-side contact layer) to the surface of the insulating layer 25 and electrically connected to the p-side contact layer. On the other hand, a lower electrode 27 is provided on the rear surface of the substrate 10 and electrically connected to the substrate 10.

The upper electrode 26A is electrically connected to a wiring (not shown) and connected to a positive-side electric source (not shown) through the wiring. The lower electrode 27 is electrically connected to a wiring (not shown) and connected to a negative-side electric source (not shown) through the wiring. Here, each of the upper electrode 26A and the lower electrode 27 has a multilayer structure which is configured by laminating, for example, titanium (Ti), platinum (Pt), and gold (Au) in this order. The wirings which are connected to the upper electrode 26A and the lower electrode 27 are constituted by Au, for example.

(Second Device Section 20B)

The second device section 20B is a semiconductor laser device having an oscillation wavelength of $\lambda_B$ ($\lambda_A < \lambda_B$). Specifically, $\lambda_B$ is a wavelength of a 790 nm band. The second device section 20B is constituted by a gallium arsenic (GaAs)-based Group III-V compound semiconductor. The gallium arsenic (GaAs)-based Group III-V compound semiconductor as referred to herein refers to a semiconductor containing at least gallium (Ga) among Group 3B elements in the short-period type periodic table and at least arsenic (As) among Group 5B elements in the short-period type periodic table.

The second device section 20B includes the semiconductor layer 21B grown on the substrate 10, similarly to the first device section 20A. The semiconductor layer 21B is configured to include an n-type cladding layer, an active layer 22B, a p-type cladding layer, and a p-side contact layer. In addition, the layers other than the active layer 22B are not shown in particular.

Specifically, the n-type cladding layer is constituted by n-type AlGaAs, for example. The active layer 22B has, for example, a multiple quantum well structure which is constituted by alternately laminating a well layer and a barrier layer. The well layer and the barrier layer are respectively constituted by, for example, $Al_xGa_{1-x}As$ (however, x≥0) having compositions different from each other. The p-type cladding layer is constituted by p-type AlGaAs, for example. The p-side contact layer is constituted by p-type GaAs, for example. A portion of the p-type cladding layer and the p-side contact layer form a stripe-shaped ridge portion 23B extending in a resonator direction, whereby current constriction is provided. In addition, the area corresponding to the ridge portion 23B of the active layer 22B becomes a light-emitting area 24B.

The above-described insulating layer 25 is provided on a continuous surface (hereinafter referred to as a surface B) from the side surface of the ridge portion 23B to the surface of the p-type cladding layer.

An upper electrode 26B is provided on a continuous surface from the upper surface of the ridge portion 23B (the surface of the p-side contact layer) to the surface of the insulating layer 25 and electrically connected to the p-side contact layer. On the other hand, the above-described lower electrode 27 is provided on the rear surface of the substrate 10 and electrically connected to the substrate 10.

The upper electrode 26B is electrically connected to a positive-side electric source (not shown) through a wiring (not shown). Here, the upper electrode 26B is constituted by laminating, for example, Ti, Pt, and Au in this order. A wiring layer 28B is constituted by Au, for example.

(Front End Face Film and Rear End Face Film)

The two-wavelength semiconductor laser device 1 further includes a pair of front end face film 30 and rear end face film 40 on faces (a front end face S1 and a rear end face S2) perpendicular to the extending directions (the resonator direction) of the first device section 20A and the second device section 20B, as shown in FIG. 1A.

The front end face film 30 is formed together on the entirety of the front end face S1. The front end face film 30 is constituted such that the reflectance of the front end face S1 of the two-wavelength semiconductor laser device 1 is, for example, 35% or less in a wavelength range of light emitted from the first device section 20A and the second device section 20B. The front end face film 30 is constituted, for example, by alternately laminating a low refractive index layer and a high refractive index layer on the front end face S1.

On the other hand, the rear end face film 40 is formed together on the entirety of the rear end face S2. The rear end face film 40 is constituted such that the reflectance of the rear end face S2 of the two-wavelength semiconductor laser device 1 is, for example, 50% or more and 85% or less in a wavelength range of light emitted from the first device section 20A and the second device section 20B.

The rear end face film 40 has a base layer 41 contacting the rear end face S2. The rear end face film 40 is configured to further include a laminated film constituted by laminating a plurality of layers each having a low refractive index layer 42 and a high refractive index layer 43 as one set on the base layer 41, and an intermediate refractive index layer 44 in order from the rear end face S2 side. The rear end face film 40 does not include a silicon (Si) film and is constituted by a film different from an Si film. The base layer 41 may also be omitted as necessary. In addition, in a case where the base layer 41 is omitted, the low refractive index layer 42 closest to the rear end face S2 comes into contact with the rear end face S2. In addition, the rear end face film 40 may also have some sort of layer such as a protective film on the intermediate refractive index layer 44.

The low refractive index layer 42 is equivalent to a specific example of a "low refractive index layer" in the appended claims. The high refractive index layer 43 is equivalent to a specific example of a "high refractive index layer" in the appended claims. The intermediate refractive index layer 44 is equivalent to a specific example of an "intermediate refractive index layer" in the appended claims.

The base layer 41 is constituted by a highly stable material which does not cause adverse effects on the rear end face S2, and is constituted by $Al_2O_3$, for example. The refractive index of the base layer 41 is set to be, for example, a value between the refractive index of the low refractive index layer 42 and the refractive index of the high refractive index layer 43. The optical film thickness of the base layer 41 is set to be a thickness adjusted such that the total optical film thickness of the base layer 41 and the low refractive index layer 42 contacting the base layer 41 is $\lambda_C/4$. Here, $\lambda_C$ is a wavelength which is larger than $\lambda_A$ and smaller than $\lambda_B$, and is $(\lambda_A+\lambda_B)/2$, for example.

The refractive indices and the optical film thicknesses of the low refractive index layer 42, the high refractive index layer 43, and the intermediate refractive index layer 44 are as follows.

| (A case where the base layer 41 is omitted) | | |
|---|---|---|
| | Refractive index | Optical film thickness |
| Low refractive index layer 42 | $n_A$ | $\lambda_C/4$ |
| High refractive index layer 43 | $n_B$ | $\lambda_C/4$ |
| Intermediate refractive index layer 44 | $n_C$ | $\lambda_C/4$ |

$\lambda_A < \lambda_C < \lambda_B$
$n_A < n_C < n_B$

| (A case where the base layer 41 is provided) | | |
|---|---|---|
| | Refractive index | Optical film thickness |
| Low refractive index layer 42 contacting the base layer 41 | $n_A$ | $(\lambda_C/4)$-(the optical film thickness of the base layer 41) |
| Low refractive index layer 42 having no contact with the base layer 41 | $n_A$ | $\lambda_C/4$ |
| High refractive index layer 43 | $n_B$ | $\lambda_C/4$ |
| Intermediate refractive index layer 44 | $n_C$ | $\lambda_C/4$ |

Here, the refractive index $n_A$ is a value of not less than 1.4 and less than 1.5. The refractive index $n_B$ is a value of not less than 2.0 and not more than 2.5. The refractive index $n_C$ is a value of not less than 1.5 and not more than 1.7. The low refractive index layer 42 is an $SiO_2$ film (refractive index: 1.45). The high refractive index layer 43 is a $Ta_2O_B$ film (refractive index: 2.1), a $TiO_2$ film, a ZnO film, an $HfO_2$ film, a $CeO_2$ film, or an $Nb_2O$ film. The intermediate refractive index layer 44 is an $Al_2O_3$ film (refractive index: 1.64) or an MgO film.

FIG. 2 shows one example of the configuration of the rear end face film 40. Two configurations are exemplified in FIG. 2. However, in either example, a case where three sets of layers each having the low refractive index layer 42 and the high refractive index layer 43 as one set are laminated is exemplified. In an example of the upper stage of FIG. 2, the base layer is constituted by $Al_2O_3$, the low refractive index layer 42 is constituted by an $SiO_2$ film, the high refractive index layer 43 is constituted by a $Ta_2O_5$ film, and the intermediate refractive index layer 44 is constituted by an $Al_2O_3$ film. On the other hand, an example of the lower stage of FIG. 2 is an example in which the base layer 41 is omitted in the example of the upper stage of FIG. 2. In the example of the lower stage of FIG. 2, the low refractive index layer 42 is in direct contact with the rear end face S2.

[Manufacturing Method]

The two-wavelength semiconductor laser device 1 having such a configuration can be manufactured as follows, for example.

First, a laser structure of the first device section 20A is made. To this end, the semiconductor layer 21A on the substrate 10 is formed by a MOCVD method, for example. At this time, as a raw material of an AlGaInP-based semiconductor, for example, trimethylaluminum (TMA), trimethylgallium (TMG), trimethylindium (TMIn), or phosphine ($PH_3$) is used, as a raw material of a donor impurity, for example, hydrogen selenide ($H_2Se$) is used, and as a raw material of an acceptor impurity, for example, dimethyl zinc (DMZn) is used.

Specifically, first, the semiconductor layer 21A is formed by laminating an n-side contact layer, the n-type cladding layer, the active layer 22A, the p-type cladding layer, and the p-side contact layer in this order on the substrate 10. Subsequently, the ridge portion 23A is formed by patterning the p-side contact layer and the p-type cladding layer so as to turn into a thin strip-shaped convex portion by a dry etching method, for example.

Next, a laser structure of the second device section 20B is made. To this end, the semiconductor layer 21B on the substrate 10 is formed by a MOCVD method, for example. At this time, as a raw material of a GaAs-based semiconductor, for example, TMA, TMG, TMIn, or arsine ($AsH_3$) is used, as a raw material of a donor impurity, for example, $H_2Se$ is used, and as a raw material of an acceptor impurity, for example, DMZn is used.

Specifically, first, the semiconductor layer 21B is formed by laminating the n-side contact layer, the n-type cladding layer, the active layer 22B, the p-type cladding layer, and the p-side contact layer in this order on the substrate 10. Subsequently, the ridge portion 23B is formed by patterning the p-side contact layer and the p-type cladding layer so as to turn into a thin strip-shaped convex portion by a dry etching method, for example. In this way, as shown in FIG. 1B, the laser structure of the first device section 20A and the laser structure of the second device section 20B are arranged on the substrate 10.

Next, after an insulating material, for example, SiN is formed on a surface including the upper surfaces of the ridge portions 23A and 23B by vapor deposition or sputtering, an area corresponding to the upper surfaces of the ridge portions 23A and 23B of the insulating material is removed by etching. In this way, the insulating layer 25 is formed.

Next, as shown in FIGS. 1A and 1B, the upper electrode 26A is formed on a continuous surface from the surface of the p-side contact layer of the ridge portion 23A to the surface of the insulating layer 25. Further, the upper electrode 26B is formed on a continuous surface from the surface of the p-side contact layer of the ridge portion 23B to the surface of the insulating layer 25. Further, the lower electrode 27 is formed on the rear surface of the substrate 10.

Next, after the front end face S1 and the rear end face S2 are formed by performing cleavage at faces perpendicular to the extending directions of the ridge portions 23A and 23B, the front end face film 30 is formed together on the front end face S1 and also the rear end face film 40 is formed together on the rear end face S2. In this way, the two-wavelength semiconductor laser device 1 related to this embodiment is manufactured.

[Operation and Effects]

Next, an operation and effects of the two-wavelength semiconductor laser device 1 related to this embodiment will be described.

In the two-wavelength semiconductor laser device 1 related to this embodiment, if a given voltage is applied between the upper electrodes 26A and 26B and the lower electrode 27, an electric current is injected into the active layers 22A and 22B, so that light emission occurs due to an electron-hole recombination. Light emitted at the respective active layers 22A and 22B is reflected by the front end face film 30 and the rear end face film 40, thereby performing lasing, and a laser beam having a wavelength of 650 nm is emitted from the first device section 20A side of the front end face film 30 to the outside and a laser beam having a wavelength of 790 nm is emitted from the second device section 20B side of the front end face film 30 to the outside. In this manner, laser beams having wavelengths different from each other are emitted from the first device section 20A and the second device section 20B.

Incidentally, in a multi-wavelength laser device which is used for the playback of an optical disc, in order to adjust a light output which is emitted from a front end face, emitted light from a rear end face is converted into an electric current by a photodiode and monitored, and this monitor current depends largely on the reflectance of the rear end face. On the other hand, in a laser device, since a wavelength varies with a change in temperature, the larger the amount of variation in the reflectance of the rear end face with respect to a wavelength, the larger a change in monitor current with respect to a change in temperature of the device becomes.

Therefore, in the past, in order to make the amount of variation in the reflectance of a high-reflection film with respect to a change in wavelength as small as possible, as a material of the high-reflection film, a material in which a difference in refractive index between a low refractive index layer and a high refractive index layer becomes large has been used. For example, as a material of the low refractive index layer, $Al_2O_3$ (refractive index: 1.64) has been used, and as a material of the high refractive index layer, Si (refractive index: 3.3) has been used. In addition, the reflectance of the high-reflection film at this time takes a profile as shown in FIG. 3, for example.

However, in a material such as Si having a refractive index exceeding 3.0, light absorption in an oscillation wavelength of 650 nm is large and damage to the film occurs. For this reason, end face degradation such as COD or ESD easily occurs. Therefore, it can be considered that in place of Si, $Ta_2O_5$ (refractive index: 2.1) having small light absorption is used and in order to make a difference in refractive index large, in place of $Al_2O_3$, $SiO_2$ is used. However, in such a case, there is a problem in that, for example, as shown in FIG. 4, the amount of variation in the reflectance of the high-reflection film with respect to a change in wavelength becomes larger than the amount of variation in FIG. 3, so that variation in monitor current with a change in temperature of the laser device becomes large.

Figure 6:
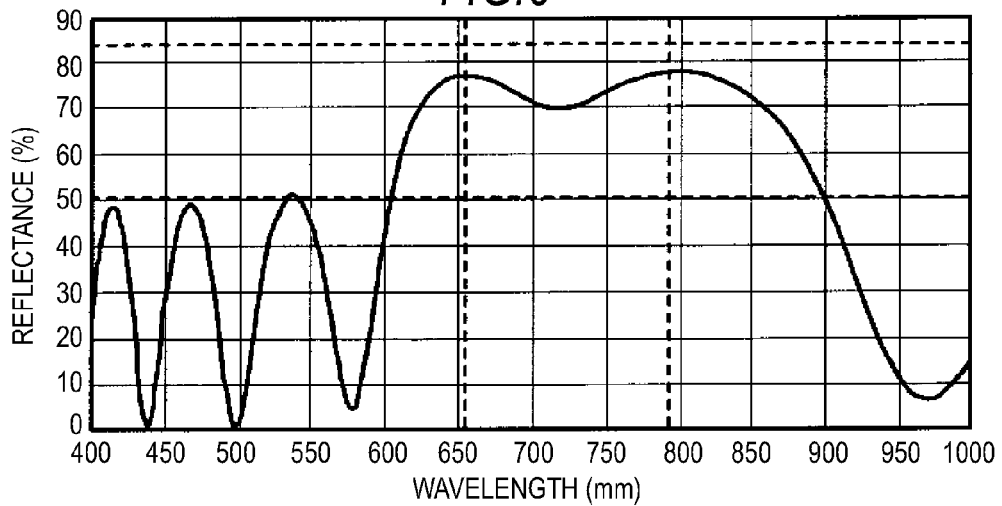
FIG. 6 is a diagram showing one example of the reflectance distribution on the rear end face side of a laser device provided with the rear end face film in FIG. 5.

Further, in JP-A-2008-16799 and JP-A-2010-171182, a configuration is proposed in which as shown in FIG. 5, $Al_2O_3$ is used in a first layer, $Ta_2O_5$ is used in a second layer, $SiO_2$ is used in a third layer, $Ta_2O_5$ is used in a fourth layer, $SiO_2$ is used in a fifth layer, $Ta_2O_5$ is used in a sixth layer, $SiO_2$ is used in a seventh layer, and $Ta_2O_5$ is used in an eighth layer. In addition, in an example of FIG. 5, the optical film thickness of each of the first to seventh layers is set to be λ/4 and only the optical film thickness of the eighth layer is set to be λ/2. However, in such a case, there is a problem in that, for example, as shown in FIG. 6, the amount of variation in the reflectance of the high-reflection film with respect to a change in wavelength is still large and variation in monitor current with a change in temperature of the laser device becomes large.

Figure 7:
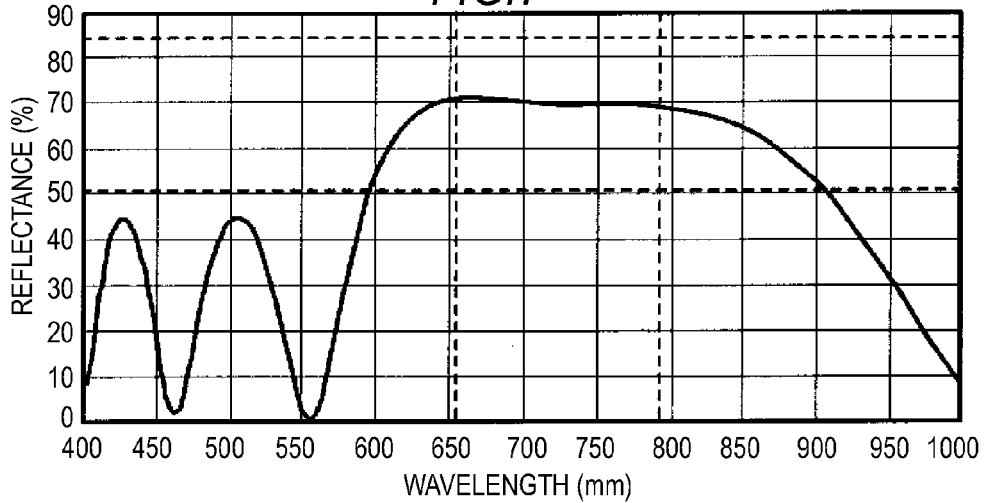
FIG. 7 is a diagram showing one example of the reflectance distribution on the rear end face side of a laser device provided with the rear end face film in FIG. 2.

On the other hand, in this embodiment, the intermediate refractive index layer 44 having a refractive index $n_C$ between the refractive index $n_A$ of the low refractive index layer 42 and the refractive index $n_B$ of the high refractive index layer 43 is formed on the surface of a layer in which the low refractive index layer 42 and the high refractive index layer 43 are alternately laminated on the rear end face S2. Further, in a case where the base layer 41 is omitted, the optical film thickness of each of these layers is set to be $\lambda_C/4$. Further, in a case where the base layer 41 is provided, in the low refractive index layer 42 having no contact with the base layer 41, the high refractive index layer 43, and the intermediate refractive index layer 44, the optical film thickness of each layer is set to be $\lambda_C/4$, and the optical film thickness of the low refractive index layer 42 contacting the base layer 41 is set to be $(\lambda_C/4)$–(the optical film thickness of the base layer 41). In this way, for example, as shown in FIG. 7, it is possible to make a wavelength-related change in the reflectance of the rear end face film 40 in a wavelength range which includes the oscillation wavelengths $\lambda_A$ and $\lambda_B$ flatter than a wavelength-related change in the reflectance in FIGS. 4 and 6. As a result, it is possible to reduce variation in monitor current with a change in temperature of the laser device. Further, in this embodiment, since the rear end face film 40 does not include an Si film, end face degradation due to light absorption of an Si film does not occur. From the above, in this embodiment, it is possible to suppress a change in monitor current with a change in temperature of the device while suppressing occurrence of end face degradation.

Further, in this embodiment, the rear end face film 40 has a single configuration formed together on the rear end face S2, as described above, and does not have a plurality of configurations in which a material, a film thickness, a layer structure, or the like is adjusted depending on a site to which a laser beam is emitted. In this way, since it is possible to form the rear end face film 40 by a small number of process steps, it is possible to manufacture a two-wavelength semiconductor laser device 1 at a low price.

2. Modified Examples

First Modified Example

In the above-described embodiment, the oscillation wavelength $\lambda_A$ of the first device section 20A is set to be a 650 nm band and the oscillation wavelength $\lambda_B$ of the second device section 20B is set to be a 790 nm band. However, the oscillation wavelengths $\lambda_A$ and $\lambda_B$ of the first device section 20A and the second device section 20B may also be set to be wavelength bands different from the above. However, it is necessary to set the oscillation wavelengths $\lambda_A$ and $\lambda_B$ to be in a range capable of making the reflectance of the rear end face film 40 in a wavelength range which includes the oscillation wavelengths $\lambda_A$ and $\lambda_B$ flat, by adjusting the optical film thickness $\lambda_C/4$ of each layer which is included in the rear end face film 40. In fact, the applicants have confirmed that if the oscillation wavelengths $\lambda_A$ and $\lambda_B$ are set to be 300 nm or more and 900 nm or less, it is possible to make the reflectance of the rear end face film 40 in a wavelength range which includes the oscillation wavelengths $\lambda_A$ and $\lambda_B$ uniform.

In addition, in principle, even in a case where the oscillation wavelengths $\lambda_A$ and $\lambda_B$ are set to be larger than 900 nm, it is possible to make the reflectance of the rear end face film 40 in a wavelength range which includes $\lambda_A$ and $\lambda_B$ flat. Further, the width of a wavelength range in which the reflectance of the rear end face film 40 becomes flat becomes wider as the optical film thickness $\lambda_C/4$ of each layer which is included in the rear end face film 40 becomes thick. Therefore, it is possible to make a difference in wavelength between the oscillation wavelengths $\lambda_A$ and $\lambda_B$ large as the optical film thickness $\lambda_C/4$ of each layer which is included in the rear end face film 40 becomes thick.

Second Modified Example

Figure 8:
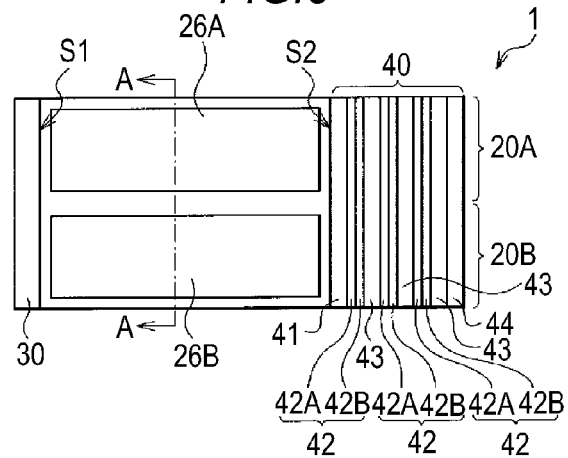
FIG. 8 is a top view showing a modified example of the configuration of the two-wavelength semiconductor laser device in FIGS. 1A and 1B.

In the above-described embodiment, the low refractive index layer 42 is constituted by a single layer. However, it may also be constituted by a plurality of layers. For example, as shown in FIG. 8, the low refractive index layer 42 may also be made of a laminated body formed by laminating a first refractive index layer 42A having the refractive index $n_A$ and a second refractive index layer 42B having the refractive index $n_C$ from the rear end face S2 side. In a case where the base layer 41 is omitted, the total optical film thickness of the first refractive index layer 42A and the second refractive index layer 42B is set to be $\lambda_C/4$. In addition, in a case where the base layer 41 is omitted, the first refractive index layer 42A closest to the rear end face S2 is in contact with the rear end face S2. Further, in a case where the base layer 41 is provided, in the low refractive index layer 42 having no contact with the base layer 41, the total optical film thickness of the first refractive index layer 42A and the second refractive index layer 42B is set to be $\lambda_C/4$, and in the low refractive index layer 42 contacting the base layer 41, the total optical film thickness of the first refractive index layer 42A and the second refractive index layer 42B is set to be $(\lambda_C/4)-$(the optical film thickness of the base layer 41). At this time, the first refractive index layer 42A is constituted by an $SiO_2$ film and the second refractive index layer 42B is constituted by an $Al_2O_3$ film or an MgO film. For example, as illustrated in the upper stage and the lower stage of FIG. 9, a configuration is also acceptable in which the first refractive index layer 42A is constituted by an $SiO_2$ film and the second refractive index layer 42B is constituted by an $Al_2O_3$ film. Further, for example, as illustrated in the upper stage and the lower stage of FIG. 10, a configuration is also acceptable in which the first refractive index layer 42A is constituted by an $Al_2O_3$ film and the second refractive index layer 42B is constituted by a $Ta_2O_5$ film.

Even in a case where the rear end face film 40 is made to have such a configuration, similarly to the above-described embodiment, it is possible to make a wavelength-related change in the reflectance of the rear end face film 40 in a wavelength range which includes the oscillation wavelengths $\lambda_A$ and $\lambda_B$ flatter than a wavelength-related change in the reflectance in FIGS. 4 and 6. As a result, it is possible to reduce variation in monitor current with a change in temperature of the laser device. Further, also in this modified example, since the rear end face film 40 does not include an Si film, end face degradation due to light absorption of an Si film does not occur. From the above, also in this modified example, it is possible to suppress a change in monitor current with a change in temperature of the device while suppressing occurrence of end face degradation.

Third Modified Example

In the above-described embodiment, for example, as shown in FIG. 11, an intermediate refractive index layer 45 may also be provided in place of the low refractive index layer 42. In this case, as shown in FIG. 11, it is possible to omit the base layer 41. In addition, in the following description, the base layer 41 is set to be omitted and the intermediate refractive index layer 45 closest to the rear end face S2 is set to be in contact with the rear end face S2.

In addition, in this modified example, the intermediate refractive index layer 45 is equivalent to a specific example of a "first low refractive index layer" in the appended claims, the high refractive index layer 43 is equivalent to a specific example of a "high refractive index layer" in the appended claims, and the intermediate refractive index layer 44 is equivalent to a specific example of a "second low refractive index layer" in the appended claims.

The refractive indices and the optical film thicknesses of the intermediate refractive index layer 45, the high refractive index layer 43, and the intermediate refractive index layer 44 are as follows.

| | Refractive index | Optical film thickness |
|---|---|---|
| Intermediate refractive index layer 45 | $n_D$ | $\lambda_C/4$ |
| High refractive index layer 43 | $n_B$ | $\lambda_C/4$ |
| Intermediate refractive index layer 44 | $n_C$ | $\lambda_C/4$ |

$n_D = n_C < n_B$

Here, the refractive indices $n_C$ and $n_D$ are set to be the same as each other and each is a value of not less than 1.5 and not more than 1.7. The refractive index $n_B$ is a value of not less than 2.0 and not more than 2.5. The intermediate refractive index layers 44 and 45 are constituted by the same material as each other and specifically, each is an $Al_2O_3$ film or an MgO film. The high refractive index layer 43 is a $Ta_2O_5$ film, a $TiO_2$ film, a ZnO film, an $HfO_2$ film, a $CeO_2$ film, or an $Nb_2O$ film.

FIG. 12 shows one example of the configuration of the rear end face film 40. In FIG. 12, a case where three sets of layers each having the intermediate refractive index layer 45 and the high refractive index layer 43 as one set are laminated is exemplified. In an example of FIG. 12, the intermediate refractive index layer 45 is constituted by an $SiO_2$ film and the high refractive index layer 43 is constituted by a $Ta_2O_5$ film.

Even in a case where the rear end face film 40 is made to have such a configuration, similarly to the above-described embodiment, it is possible to make a wavelength-related change in the reflectance of the rear end face film 40 in a wavelength range which includes the oscillation wavelengths $\lambda_A$ and $\lambda_B$ flatter than a wavelength-related change in the reflectance in FIGS. 4 and 6. As a result, it is possible to reduce variation in monitor current with a change in temperature of the laser device. Further, also in this modified example, since the rear end face film 40 does not include an Si film, end face degradation due to light absorption of an Si film does not occur. From the above, also in this modified example, it is possible to suppress a change in monitor current with a change in temperature of the device while suppressing occurrence of end face degradation.

Although the present disclosure has been described above citing an embodiment and modified examples, the present disclosure is not limited to the above-described embodiment and the like and various modifications can be made.

For example, in the above-described embodiment and modified examples, the conductivity types of a p type and an n type may also be set to be opposite to those in the above description. Further, although in the above-described embodiment and modified examples, a case where the present disclosure is applied to a two-wavelength semiconductor laser device has been described, of course, it is also possible to apply the present disclosure to a three-wavelength or more semiconductor laser device.

Further, for example, the present disclosure can take the following configurations.

(1) A multi-wavelength semiconductor laser device including: first and second device sections monolithically formed on a substrate; and a rear end face film formed together on a rear end face of each of the first device section and the second device section, wherein the first device section is a light-emitting device section having an oscillation wavelength of $\lambda_1$, the second device section is a light-emitting device section having an oscillation wavelength of $\lambda_2$ ($\lambda_1 < \lambda_2$), the rear end face film includes a layer in which N sets (N≥2) of layers each having the combination of a low refractive index layer having a refractive index of $n_1$ and a high refractive index layer having a refractive index of $n_3$ ($n_1 < n_3$) as one set are laminated, and an intermediate refractive index layer having a refractive index of $n_2$ ($n_1 < n_2 < n_3$) in order from the rear end face side, and is constituted by a film different from an Si film, and the optical film thickness of each of the low refractive index layer, the high refractive index layer, and the intermediate refractive index layer is set to be $\lambda_3/4$ when a wavelength between $\lambda_1$ and $\lambda_2$ is set to be $\lambda_3$.

(2) The multi-wavelength semiconductor laser device according to the above (1), wherein the refractive index $n_1$ is a value of not less than 1.4 and less than 1.5, the refractive index $n_2$ is a value of not less than 1.5 and not more than 1.7, and the refractive index $n_3$ is a value of not less than 2.0 and not more than 2.5.

(3) The multi-wavelength semiconductor laser device according to the above (2), wherein the low refractive index layer is an $SiO_2$ layer, the high refractive index layer is a $Ta_2O_5$ layer, a $TiO_2$ layer, a ZnO layer, an $HfO_2$ layer, a $CeO_2$ layer, or an $Nb_2O$ film, and the intermediate refractive index layer is an $Al_2O_3$ layer or an MgO layer.

(4) The multi-wavelength semiconductor laser device according to the above (2), wherein the low refractive index layer is a layer in which an $SiO_2$ layer and an $Al_2O_3$ layer or an MgO layer are laminated, the high refractive index layer is a $Ta_2O_5$ layer, a $TiO_2$ layer, a ZnO layer, an $HfO_2$ layer, a $CeO_2$ layer, or an $Nb_2O$ layer, and the intermediate refractive index layer is an $Al_2O_3$ layer or an MgO layer.

(5) The multi-wavelength semiconductor laser device according to any one of the above (1) to (4), wherein the low refractive index layer closest to the rear end face is in contact with the rear end face.

(6) The multi-wavelength semiconductor laser device according to any one of the above (1) to (4), wherein the rear end face film includes a base layer having a refractive index of $n_4$ ($n_1 < n_4 < n_3$), a second low refractive index layer having a refractive index of $n_1$, and a second high refractive index layer having a refractive index of $n_3$ in order from the rear end face side between the rear end face and the low refractive index layer closest to the rear end face, the optical film thickness of the second high refractive index layer is set to be $\lambda_3/4$, the optical film thickness of the second low refractive index layer is set to be ($\lambda_3/4$)-(the optical film thickness of the base layer), and the optical film thickness of the base layer is set to be a thickness adjusted such that the total optical film thickness of the base layer and the second low refractive index layer becomes $\lambda_3/4$.

(7) A multi-wavelength semiconductor laser device including: first and second device sections monolithically formed on a substrate; and a rear end face film formed together on a rear end face of each of the first device section and the second device section, wherein the first device section is a light-emitting device section having an oscillation wavelength of $\lambda_1$, the second device section is a light-emitting device section having an oscillation wavelength of $\lambda_2$ ($\lambda_1 < \lambda_2$), the rear end face film includes a layer in which N sets (N≥2) of layers each having the combination of a first low refractive index layer having a refractive index of $n_1$ and a high refractive index layer having a refractive index of $n_3$ ($n_1 < n_3$) as one set are laminated, and a second low refractive index layer having a refractive index of $n_1$ in order from the rear end face side, and is constituted by a film different from an Si film, and the optical film thickness of each of the first low refractive index layer, the high refractive index layer, and the second low refractive index layer is set to be $\lambda_3/4$ when a wavelength between $\lambda_1$ and $\lambda_2$ is set to be $\lambda_3$.

(8) The multi-wavelength semiconductor laser device according to the above (7), wherein the refractive index $n_1$ is a value of not less than 1.5 and not more than 1.7, and the refractive index $n_3$ is a value of not less than 2.0 and not more than 2.5.

(9) The multi-wavelength semiconductor laser device according to the above (8), wherein each of the first low refractive index layer and the second low refractive index layer is an $Al_2O_3$ layer or an MgO layer, and the high refractive index layer is a $Ta_2O_5$ layer, a $TiO_2$ layer, a ZnO layer, an $HfO_2$ layer, a $CeO_2$ layer, or an $Nb_2O$ layer.

(10) The multi-wavelength semiconductor laser device according to the above (7), wherein the first low refractive index layer closest to the rear end face is in contact with the rear end face.

The present disclosure contains subject matter related to those disclosed in Japanese Priority Patent Applications JP 2011-075471 and JP 2011-116106 filed in the Japan Patent Office on Mar. 30, 2011 and May 24, 2011, respectively, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A multi-wavelength semiconductor laser device comprising:
   first and second device sections monolithically formed on a substrate;
   a first active layer and a second active layer;
   a stripe-shaped ridge portion extending in a perpendicular direction to each of the first and second device sections, wherein current constriction is provided, wherein the stripe-shaped ridge portion consists of a first ridge portion and a second ridge portion corresponding to the first and second device sections, respectively, and wherein the first ridge portion and the second ridge portion are asymmetrical and the first ridge portion forms a first off-centered light emitting area disposed on the first active layer and the second ridge portion forms a second off-centered light emitting area disposed on the second active layer;
   a first upper electrode and a second upper electrode, wherein the first upper electrode is disposed on the upper surface of the first ridge portion and the second upper electrode is disposed on the upper surface of the second ridge portion, wherein the entirety of the first upper electrode is parallel to the first active layer and at least a portion of the second upper electrode is not parallel to the second active layer; and
   a rear end face film formed together on a rear end face of each of the first device section and the second device section,
   wherein the first device section is a light-emitting device section having an oscillation wavelength of $\lambda_1$,
   the second device section is a light-emitting device section having an oscillation wavelength of $\lambda_2$ ($\lambda_1 < \lambda_2$),
   the rear end face film includes a layer in which N sets (N≥2) of layers each having the combination of a low refractive index layer having a refractive index of $n_1$ and a high refractive index layer having a refractive index of $n_3$ ($n_1 < n_3$) as one set are laminated, and an intermediate refractive index layer having a refractive index of $n_2$ ($n_1 < n_2 < n_3$) in order from the rear end face of the respective device section such that the N sets of layers are disposed between the rear end face and the intermediate refractive index layer, and is constituted by a film different from an Si film, and
   the optical film thickness of each of the low refractive index layer, the high refractive index layer, and the intermediate refractive index layer is set to be $\lambda_3/4$ when a wavelength between $\lambda_1$ and $\lambda_2$ is set to be $\lambda_3$.

2. The multi-wavelength semiconductor laser device according to claim 1, wherein the refractive index $n_1$ is a value of greater than or equal to 1.4 and less than 1.5,
   the refractive index $n_2$ is a value of not less than 1.5 and not more than 1.7, and
   the refractive index $n_3$ is a value of not less than 2.0 and not more than 2.5.

3. The multi-wavelength semiconductor laser device according to claim 2, wherein the low refractive index layer is an $SiO_2$ layer,
   the high refractive index layer is a $Ta_2O_5$ layer, a $TiO_2$ layer, a ZnO layer, an $HfO_2$ layer, a $CeO_2$ layer, or an $Nb_2O$ film, and
   the intermediate refractive index layer is an $Al_2O_3$ layer or an MgO layer.

4. The multi-wavelength semiconductor laser device according to claim 2, wherein the low refractive index layer is a layer in which an $SiO_2$ layer and an $Al_2O_3$ layer or an MgO layer are laminated,
   the high refractive index layer is a $Ta_2O_5$ layer, a $TiO_2$ layer, a ZnO layer, an $HfO_2$ layer, a $CeO_2$ layer, or an $Nb_2O$ layer, and
   the intermediate refractive index layer is an $Al_2O_3$ layer or an MgO layer.

5. The multi-wavelength semiconductor laser device according to claim 1, wherein the low refractive index layer closest to the rear end face is in contact with the rear end face.

6. The multi-wavelength semiconductor laser device according to claim 1, wherein the rear end face film includes a base layer having a refractive index of $n_4$ ($n_1 < n_4 < n_3$), a second low refractive index layer having a refractive index of $n_1$, and a second high refractive index layer having a refractive index of $n_3$ in order from the rear end face side between the rear end face and the low refractive index layer closest to the rear end face,
   the optical film thickness of the second high refractive index layer is set to be $\lambda_3/4$,
   the optical film thickness of the second low refractive index layer is set to be ($\lambda_3/4$)-(the optical film thickness of the base layer), and
   the optical film thickness of the base layer is set to be a thickness adjusted such that the total optical film thickness of the base layer and the second low refractive index layer becomes $\lambda_3/4$.

7. A multi-wavelength semiconductor laser device comprising:
   first and second device sections monolithically formed on a substrate;
   a first active layer and a second active layer;
   a stripe-shaped ridge portion extending in a perpendicular direction to each of the first and second device sections, wherein current constriction is provided, wherein the stripe-shaped ridge portion consists of a first ridge portion and a second ridge portion corresponding to the first and second device sections, respectively, and wherein the first ridge portion and the second ridge portion are asymmetrical and the first ridge portion forms a first off-centered light emitting area disposed on the first active layer and the second ridge portion forms a second off-centered light emitting area disposed on the second active layer;
   a first upper electrode and a second upper electrode, wherein the first upper electrode is disposed on the upper surface of the first ridge portion and the second upper electrode is disposed on the upper surface of the second ridge portion, wherein the entirety of the first upper electrode is parallel to the first active layer and at least a portion of the second upper electrode is not parallel to the second active layer; and
   a rear end face film formed together on a rear end face of each of the first device section and the second device section,
   wherein the first device section is a light-emitting device section having an oscillation wavelength of $\lambda_1$,
   the second device section is a light-emitting device section having an oscillation wavelength of $\lambda_2$ ($\lambda_1 < \lambda_2$), the rear end face film includes a layer in which N sets (N≥2) of layers each having the combination of a first low refractive index layer having a refractive index of $n_1$ and a high refractive index layer having a refractive index of $n_3$ ($n_1<n_3$) as one set are laminated, and a second low refractive index layer having a refractive index of $n_1$ in order from the rear end face side, and is constituted by a film different from an Si film, and the optical film thickness of each of the first low refractive index layer, the high refractive index layer, and the second low refractive index layer is set to be $\lambda_3/4$ when a wavelength between $\lambda_1$ and $\lambda_2$ is set to be $\lambda_3$.

8. The multi-wavelength semiconductor laser device according to claim 7, wherein the refractive index $n_1$ is a value of not less than 1.5 and not more than 1.7, and the refractive index $n_3$ is a value of not less than 2.0 and not more than 2.5.

9. The multi-wavelength semiconductor laser device according to claim 8, wherein each of the first low refractive index layer and the second low refractive index layer is an $Al_2O_3$ layer or an MgO layer, and the high refractive index layer is a $Ta_2O_5$ layer, a $TiO_2$ layer, a ZnO layer, an $HfO_2$ layer, a $CeO_2$ layer, or an $Nb_2O$ layer.

10. The multi-wavelength semiconductor laser device according to claim 7, wherein the first low refractive index layer closest to the rear end face is in contact with the rear end face.

\* \* \* \* \*